(12) United States Patent
Kajitani et al.

(10) Patent No.: US 12,727,125 B2
(45) Date of Patent: Sep. 1, 2026

(54) IMMERSION COOLING DEVICE AND CONTROL METHOD THEREFOR

(71) Applicant: MITSUBISHI HEAVY INDUSTRIES, LTD., Tokyo (JP)

(72) Inventors: Fumito Kajitani, Tokyo (JP); Minoru Matsuo, Tokyo (JP); Naohiko Matsuda, Tokyo (JP); Shinnosuke Osafune, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 131 days.

(21) Appl. No.: 18/570,327

(22) PCT Filed: Feb. 14, 2022

(86) PCT No.: PCT/JP2022/005658
§ 371 (c)(1),
(2) Date: Dec. 14, 2023

(87) PCT Pub. No.: WO2022/264503
PCT Pub. Date: Dec. 22, 2022

(65) Prior Publication Data

US 2024/0224476 A1 Jul. 4, 2024

(30) Foreign Application Priority Data

Jun. 17, 2021 (JP) ................................ 2021-100666

(51) Int. Cl.
*H05K 7/20* (2006.01)

(52) U.S. Cl.
CPC ..... *H05K 7/20836* (2013.01); *H05K 7/20236* (2013.01); *H05K 7/20272* (2013.01); *H05K 7/20772* (2013.01)

(58) Field of Classification Search
CPC .... H01L 23/44; H05K 7/203; H05K 7/20281; H05K 7/20272; H05K 7/20263; H05K 7/20236
See application file for complete search history.

(56) References Cited

U.S. PATENT DOCUMENTS 5,103,374 A 4/1992 Azar
5,515,910 A * 5/1996 Hamilton ............... G01R 31/30
324/750.08

(Continued)

FOREIGN PATENT DOCUMENTS

JP h04-229697 A 8/1992
JP 2000-286579 A 10/2000

(Continued)

OTHER PUBLICATIONS

International Search Report in corresponding International Application No. PCT/JP2022/005658, dated May 17, 2022 (5 pages).

(Continued)

*Primary Examiner* — Steve S Tanenbaum
(74) *Attorney, Agent, or Firm* — Osha Bergman Watanabe & Burton LLP

(57) ABSTRACT

An immersion cooling device includes a container which stores therein a cooling liquid, a substrate which is disposed so as to be immersed in the cooling liquid in the container and to which a plurality of electronic components are mounted, and nozzles which eject the cooling liquid such that the cooling liquid flows from one end of the substrate to the other end of the substrate, over the surface on which the electronic components are provided. A plurality of nozzles are provided so that a plurality of cooling liquid currents flowing from the one end to the other end of the substrate are formed in parallel.

6 Claims, 6 Drawing Sheets

(56) References Cited

U.S. PATENT DOCUMENTS

| | | | | |
|---|---|---|---|---|
| 2015/0181762 | A1* | 6/2015 | Boyd | H05K 7/20236 165/104.33 |
| 2017/0265328 | A1* | 9/2017 | Sasaki | H05K 7/20781 |
| 2017/0354066 | A1* | 12/2017 | Kodama | H05K 7/20836 |
| 2020/0037467 | A1* | 1/2020 | Ishinabe | H05K 7/20236 |
| 2020/0120831 | A1* | 4/2020 | Saito | H05K 7/20236 |
| 2020/0390007 | A1 | 12/2020 | Edmunds et al. | |
| 2021/0321542 | A1 | 10/2021 | Edmunds et al. | |
| 2022/0217874 | A1 | 7/2022 | Edmunds et al. | |

FOREIGN PATENT DOCUMENTS

| | | | |
|---|---|---|---|
| JP | 2006-108720 | A | 4/2006 |
| JP | 2019-537152 | A | 12/2019 |
| JP | 6658312 | B2 | 3/2020 |
| WO | 2018-096362 | A1 | 5/2018 |

OTHER PUBLICATIONS

Written Opinion in corresponding International Application No. PCT/JP2022/005658, dated May 17, 2022 (6 pages).

Office Action issued in counterpart Japanese Application No. 2021-100666, dated Nov. 12, 2024 (4 pages).

Office Action issued in counterpart German Application No. 112022002192.6, dated Nov. 11, 2024 (12 pages).

* cited by examiner

IMMERSION COOLING DEVICE AND CONTROL METHOD THEREFOR

TECHNICAL FIELD

The present disclosure relates to, for example, an immersion cooling device suitably used for cooling a server in a data center, and a control method therefor.

BACKGROUND ART

In PTL 1, it is disclosed that an electronic device, such as a server or a storage in a data center is immersed in a cooling liquid for cooling.

CITATION LIST

Patent Literature

[PTL 1] Japanese Patent No. 6658312

SUMMARY OF INVENTION

Technical Problem

In accordance with the above-mentioned PTL 1, cooling performance is improved by appropriately narrowing a flow path width of the cooling liquid at a position that corresponds to an electronic component having a high temperature.

However, although an average flow speed in a region can be increased by narrowing the flow path width, a flow speed cannot be increased to a desired degree depending on the position of the electronic component in a width direction, and there is a concern that sufficient cooling cannot be realized.

The present disclosure, made in consideration of these circumstances, aims to provide an immersion cooling device capable of selectively cooling an electronic component that requires cooling, and a control method therefor.

Solution to Problem

According to the present disclosure, there is provided an immersion cooling device including a container in which a cooling liquid is stored, a substrate that is disposed to be immersed in the cooling liquid in the container and to which a plurality of electronic components are mounted, and a nozzle that ejects the cooling liquid such that the cooling liquid flows from one end toward the other end of the substrate, over a surface on which the electronic components are provided, in which a plurality of the nozzles are provided such that a plurality of cooling liquid flows flowing from the one end toward the other end of the substrate are formed to be parallel.

According to the present disclosure, there is provided a control method for an immersion cooling device including a container in which a cooling liquid is stored, a substrate that is disposed to be immersed in the cooling liquid in the container and to which a plurality of electronic components are mounted, and a nozzle that ejects the cooling liquid such that the cooling liquid flows from one end toward the other end of the substrate, over a surface on which the electronic components are provided, in which a plurality of the nozzles are provided such that a plurality of cooling liquid flows flowing from the one end toward the other end of the substrate are formed to be parallel, the control method including: regulating a flow rate of the cooling liquid ejected from each nozzle.

Advantageous Effects of Invention

Electronic components that require cooling can be selectively cooled.

DESCRIPTION OF EMBODIMENTS

Hereinafter, a plurality of embodiments according to the present disclosure will be described with reference to the drawings.

First Embodiment

Hereinafter, a first embodiment of the present disclosure will be described.

Figure 1:
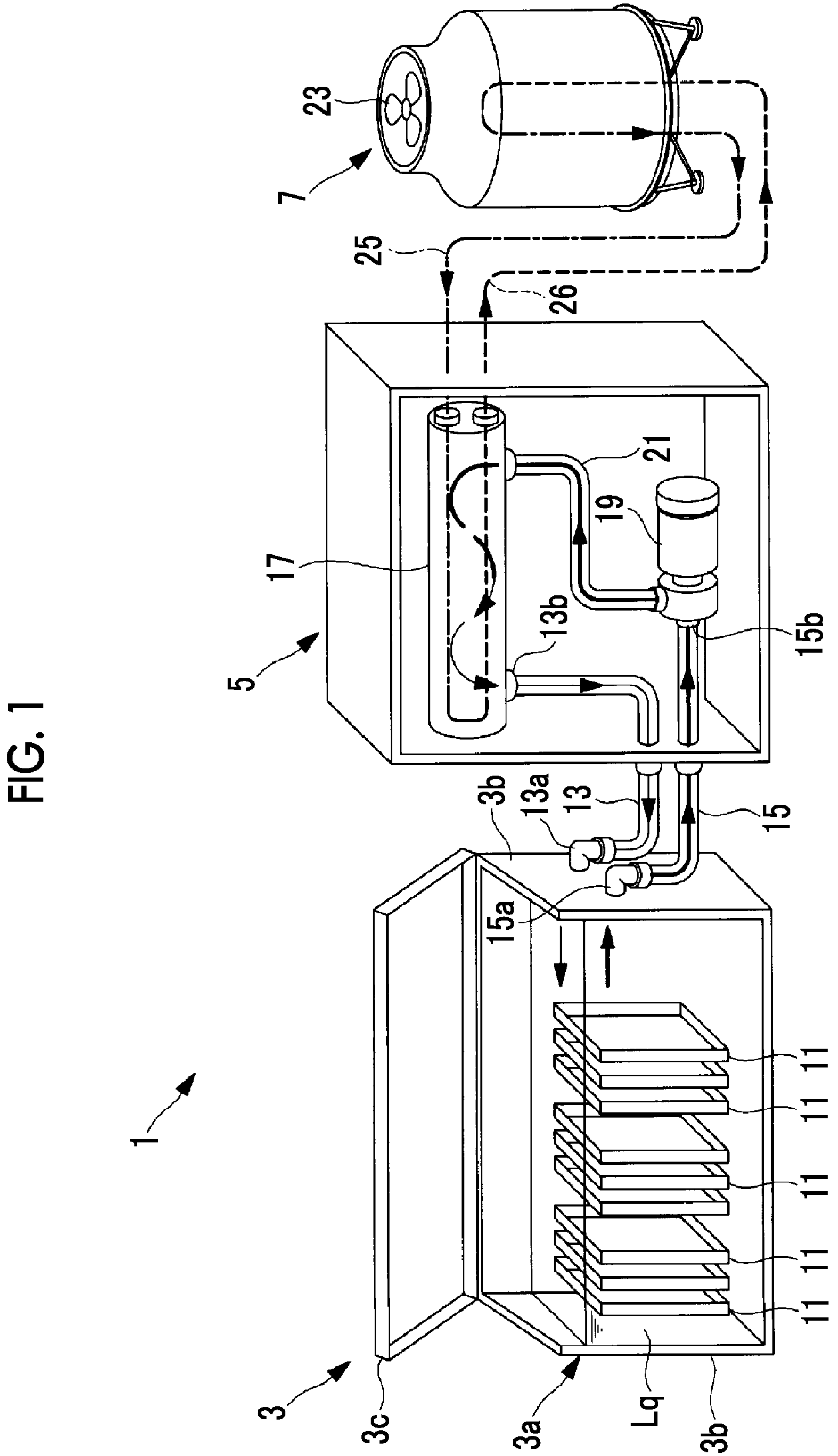
FIG. 1 is a schematic view illustrating an immersion cooling device according to a first embodiment of the present disclosure.

FIG. 1 illustrates a schematic configuration of an immersion cooling device 1. The immersion cooling device 1 includes a liquid tank rack (container) 3, a pump unit 5, and a cooling device 7.

The liquid tank rack 3 is a bottomed container in which a cooling liquid Lq is stored. The liquid tank rack 3 includes a main body 3*a* having side wall portions 3*b* on all four sides which are bottomed, and an opening-closing lid 3*c* provided on an upper surface of the main body 3*a*.

As the cooling liquid Lq, a liquid having electrical insulation is used, and for example, a silicone-based oil or the like is used. The cooling liquid Lq is filled to a height at which an entire substrate 11 installed in the main body 3*a* of the liquid tank rack 3 is immersed.

The opening-closing lid 3*c* opens and closes by rotating around one end thereof.

A plurality of substrates 11 are installed in the main body 3*a* of the liquid tank rack 3. Each substrate 11, for example, is a substrate that constitutes a server, and is arranged at a predetermined interval in a state in which a longitudinal direction is directed to a vertical direction.

The pump unit 5 is connected to the liquid tank rack 3 through a liquid feed pipe 13 and a liquid return pipe 15.

A downstream end 13*a* of the liquid feed pipe 13 is connected to the side wall portion 3*b* of the liquid tank rack 3. An upstream end 13*b* of the liquid feed pipe 13 is connected to a heat exchanger 17 installed inside the pump unit 5.

An upstream end 15*a* of the liquid return pipe 15 is connected to the side wall portion 3*b* of the liquid tank rack. A downstream end 15*b* of the liquid return pipe 15 is connected to a liquid pump 19 installed inside the pump unit 5.

The pump unit 5 includes the above-described heat exchanger 17 and the above-described liquid pump 19 within. The heat exchanger 17 exchanges heat between cooling water supplied from the cooling device 7 and a cooling liquid supplied from the liquid pump 19 through a cooling liquid ejecting pipe 21. The cooling liquid is cooled by exchanging heat with the cooling water in the heat exchanger 17.

The liquid pump 19, for example, may be driven by an electric motor, and an ejecting amount may be variable by a control unit (not illustrated).

The cooling device 7 cools the cooling water by exchanging heat with outside air. The cooling device 7 includes a fan 23, and the fan 23 draws in the outside air for cooling. A start/stop and a rotation speed of the fan 23 are controlled by the control unit (not illustrated).

A cooling water supply pipe 25 and a cooling water return pipe 26 are provided between the cooling device 7 and the heat exchanger 17 of the pump unit 5. The cooling water, which has been cooled by the cooling device 7, is supplied to the heat exchanger 17 through the cooling water supply pipe 25. The cooling water, after being heat-exchanged in the heat exchanger 17 is returned to the cooling device 7 through the cooling water return pipe 26.

The cooling device 7 may be omitted. In this case, the heat exchanger 17 provided in the pump unit 5 is changed to air cooling in which the cooling liquid is cooled using the outside air.

Figure 2:
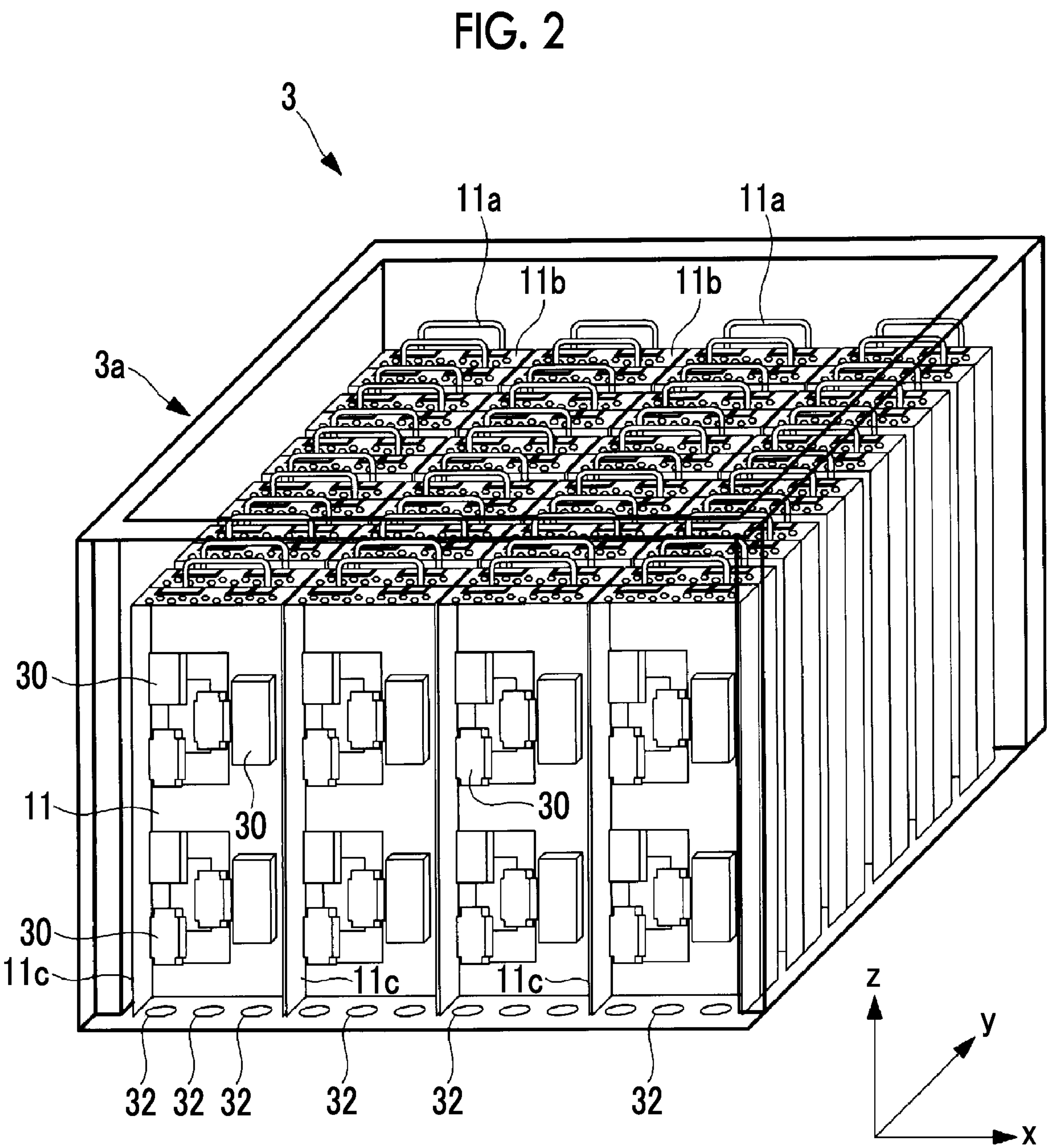
FIG. 2 is a perspective view illustrating a specific example of the inside of a liquid tank rack in FIG. 1.

FIG. 2 illustrates the plurality of substrates 11 installed in the main body 3*a* of the liquid tank rack 3. In an example illustrated in FIG. 2, four substrates 11 are provided in a width direction (x direction in FIG. 2) of the substrate 11, and twelve substrates 11 are provided in a depth direction (y direction in FIG. 2) of the substrate 11. However, the number of substrates 11 installed is not limited to the above configuration.

Each substrate 11 is mounted with a plurality of electronic components 30, for example, a CPU, a power supply unit, a memory, a storage, such as a hard disk or a solid-state drive (SSD) or the like, and a communication unit for configuring a server. These electronic components 30 generate heat during the operation of the server and are cooled by the cooling liquid Lq.

A grip portion 11*a* for an operator to grip is fixed to an upper end of each substrate 11.

Perforated walls 11*b* are provided so as to be orthogonal to the upper end of each substrate 11. The perforated walls 11*b* are erected on a surface side on which the electronic component 30 is provided. The perforated walls 11*b* are made of, for example, a punching metal with a large number of holes formed. A flow rate of the cooling liquid flowing on the surface of the substrate 11 is regulated by appropriately setting the number and the diameter of the holes of the perforated walls 11*b*.

Side plates 11*c* extending in the vertical direction are provided on both sides of each of the substrates 11. The side plates 11*c* are provided so as to be erected on a surface side on which the electronic components 30 are provided, and are continuously provided over the entire longitudinal direction (vertical direction, z direction) of the substrates 11. By surrounding both sides of the substrate 11 with the side plates 11*c*, a flow of the cooling liquid Lq flowing on the surface of the substrate 11 is guided.

A plurality of nozzles 32 are provided below each substrate 11. The nozzle 32 ejects the cooling liquid such that the cooling liquid flows from one end (lower end) to the other end (upper end) of the substrate 11, over the surface of the substrate 11 on which the electronic component 30 is provided.

The plurality of nozzles 32 are provided for each substrate 11. Specifically, the plurality of nozzles 32 are provided to be parallel in the width direction (x direction) of the substrate 11. As a result, a plurality of flows of the cooling liquid Lq flowing from the lower end to the upper end of the substrate 11 are formed to be parallel. The number of nozzles 32 need only be 2 or more with respect to one substrate 11, and is appropriately set according to the flow of the cooling liquid Lq, cooling performance required in design, or the like.

Similarly, the nozzles 32 are provided corresponding to each substrate 11 in the depth direction (y direction in FIG. 2). Therefore, although not illustrated, the nozzles 32 are also provided between each substrate 11 arranged in the y direction.

Figure 3:
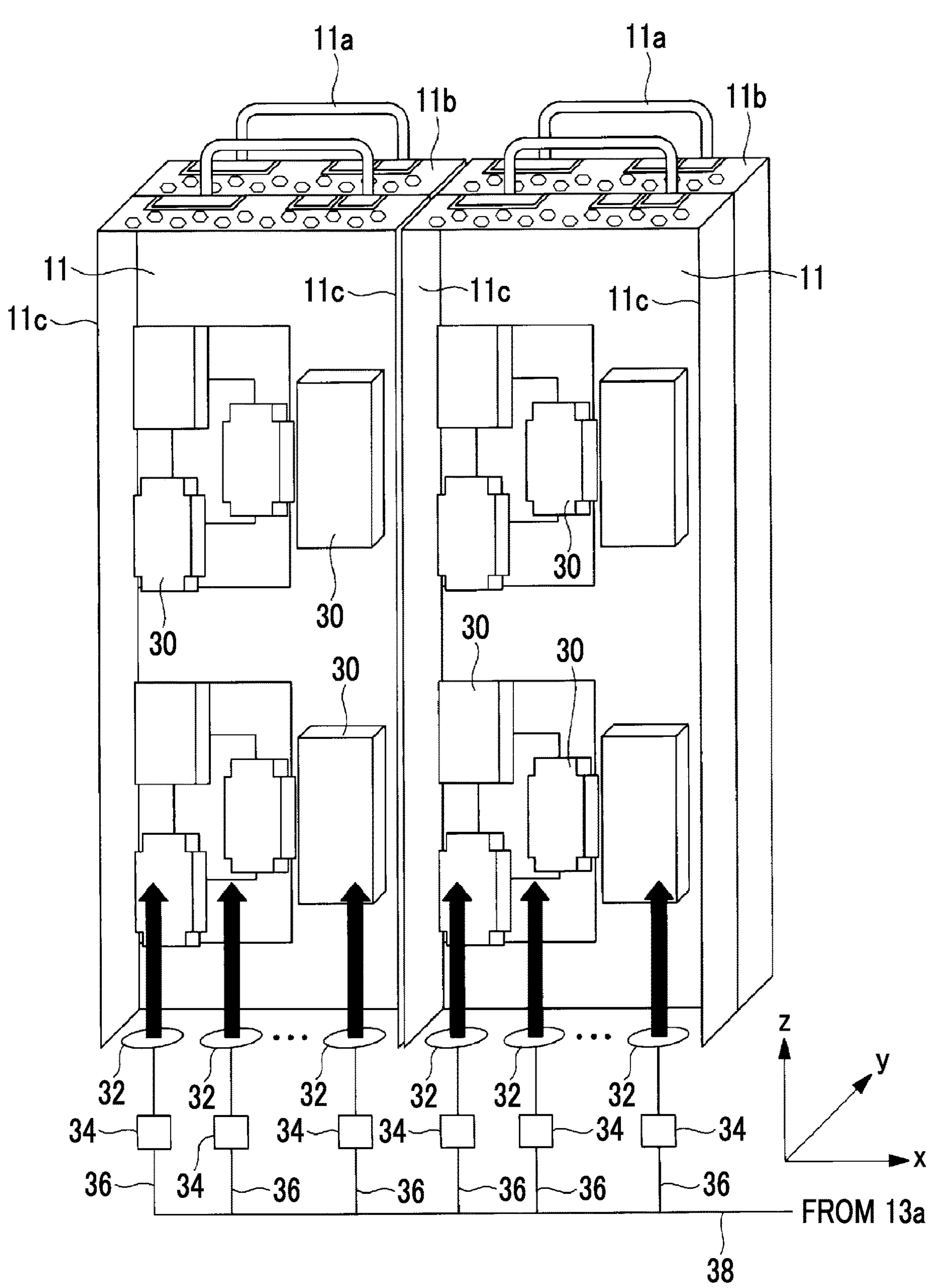
FIG. 3 is a perspective view illustrating a cooling liquid flow with respect to each substrate in FIG. 2.

As illustrated in FIG. 3, each nozzle 32 is provided with a flow rate regulating unit 34. The flow rate regulating unit 34 regulates the flow rate of the cooling liquid Lq ejected from the nozzle 32. Examples of the flow rate regulating unit include a flow rate regulating valve. The flow rate regulating unit 34 is controlled by the control unit (not illustrated).

A main supply pipe 38 is connected to an upstream side of each flow rate regulating unit 34 through a branch pipe 36. The upstream side of the main supply pipe 38 is connected to the downstream end 13*a* (refer to FIG. 1) of the liquid feed pipe 13. Therefore, the cooling liquid Lq guided from the liquid feed pipe 13 is distributed to each branch pipe 36 through the main supply pipe 38.

The control unit includes, for example, a central processing unit (CPU), a random-access memory (RAM), a read-only memory (ROM), a computer-readable storage medium, and the like. A series of processing for realizing various functions is stored in a storage medium or the like in the form of a program, as an example, and the CPU reads out this program to a RAM or the like, and executes processing for information processing and calculation, whereby various functions are realized. As the program, a form installed in advance in a ROM or other storage medium, a form of being provided in a state where it is stored in a computer-readable storage medium, a form of being delivered via wired or wireless communication means, or the like may be applied. The computer-readable storage medium is an SSD, a magnetic disk, a magneto-optical disk, a CD-ROM, a DVD-ROM, a semiconductor memory, or the like.

Next, the operation of the immersion cooling device 1 with the above-described configuration will be described.

As illustrated in FIG. 1, the liquid pump 19 is started by a command from the control unit, causing the cooling liquid Lq to flow to be guided to the heat exchanger 17. In the heat exchanger 17, the cooling liquid Lq is cooled by exchanging heat with the cooling water that has been cooled by the cooling device 7. The cooling liquid Lq exiting the heat exchanger 17 is guided to the liquid tank rack 3 through the liquid feed pipe 13. As illustrated in FIG. 3, the cooling liquid Lq guided to the liquid tank rack 3 is distributed from the liquid feed pipe 13 to each branch pipe 36 through the main supply pipe 38. The cooling liquid Lq guided to each branch pipe 36 is guided to the nozzle 32 to be ejected after the flow rate is regulated by the flow rate regulating unit 34 based on a command from the control unit.

The cooling liquid Lq ejected from each nozzle 32 is guided to the lower end of the substrate 11, passes over the surface of the substrate 11 on which the electronic component 30 is provided while the cooling liquid Lq is guided by the side plate 11*c*, and flows toward the upper end of the substrate 11. At this time, an amount of heat generated from the electronic component 30 is extracted by the cooling liquid Lq, so that the electronic component 30 is cooled.

The cooling liquid Lq in which the electronic component 30 is cooled passes through a hole in the perforated wall 11*b* provided at the upper end of the substrate 11, so that the cooling liquid Lq is discharged from the upper side of the substrate 11. The cooling liquid Lq discharged from the upper side of the substrate 11 merges with the cooling liquid Lq stored in the main body 3*a* of the liquid tank rack 3 to be mixed.

A portion of the cooling liquid Lq stored in the main body 3*a* is drawn out from the liquid return pipe 15 and is guided to the heat exchanger 17 through the liquid pump 19, so that the portion of the cooling liquid Lq is cooled, and the portion of the cooling liquid Lq is guided to the liquid tank rack 3 through the liquid feed pipe 13 again.

The flow rate of each nozzle 32 is changed according to a heat generation amount of the electronic component 30 by a command from the control unit. In FIG. 3, ejecting amounts from each nozzle 32 are the same. The flow rate of the cooling liquid Lq ejected from each nozzle 32 is indicated by a size of an arrow. The pattern of ejecting the same flow rate from each nozzle 32, as illustrated in FIG. 3, is used in a case where a load of each electronic component 30 is in a normal state as presumed in advance.

Figure 4:
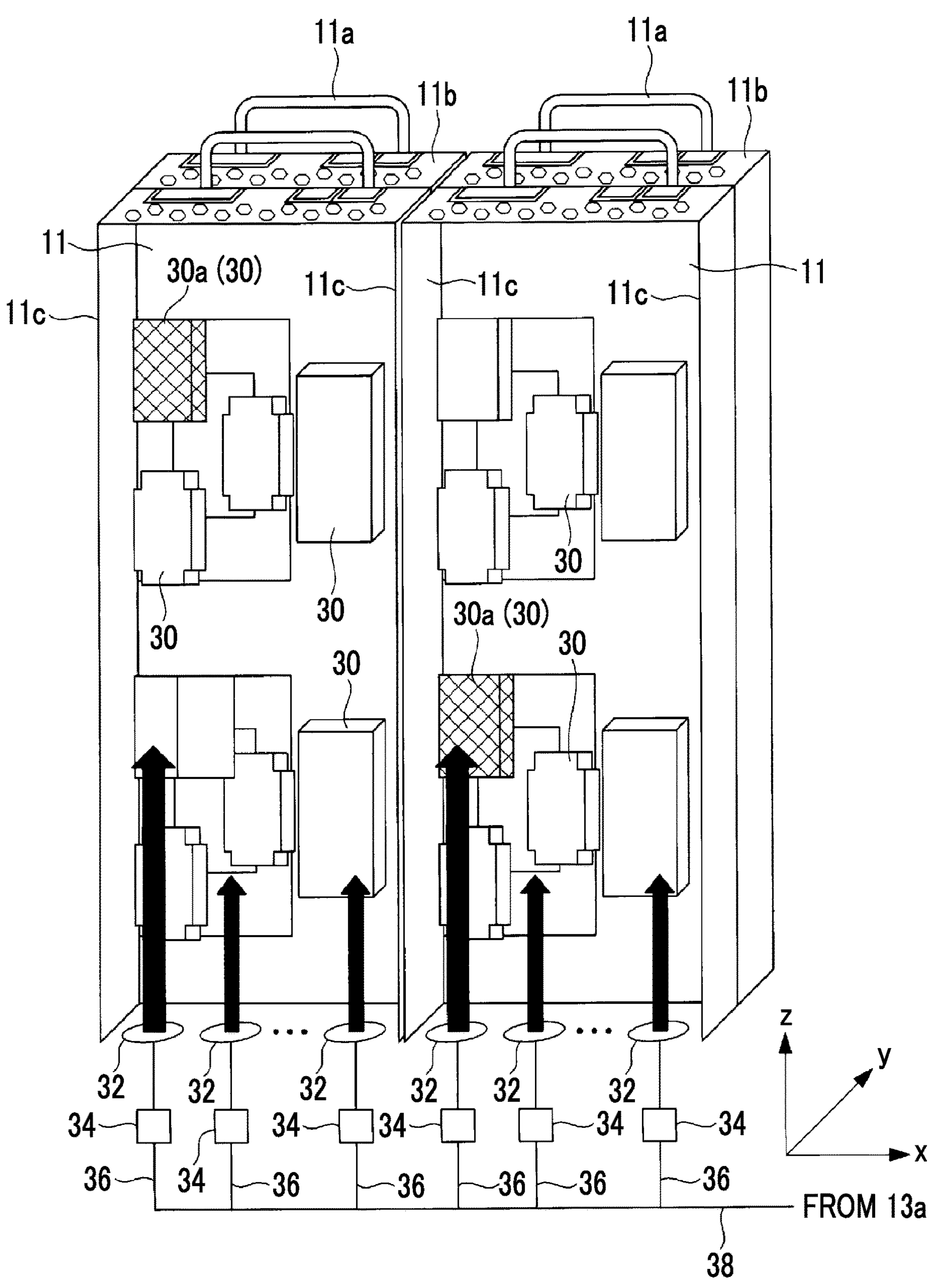
FIG. 4 is a perspective view illustrating a state in which a flow rate of each nozzle is changed with respect to FIG. 3.

On the other hand, in a case where it is predicted that the load of a specific electronic component 30 is larger than that of the normal state and that the heat generation amount is larger than that of the normal state, as illustrated in FIG. 4, the ejecting amount of the nozzle 32 corresponding to a specific electronic component 30*a* is increased to be larger than ejecting amounts of the other nozzles 32. Specifically, the ejecting amount of the nozzle 32 positioned directly below the specific electronic component 30*a* is increased. In prediction of the heat generation amount of the electronic component 30, for example, the ejecting amount of the nozzle 32 corresponding to an electronic component 30*a* (for example, CPU) in which the heat generation amount is increased according to a calculation load is increased in accordance with a time at which the calculation load is already increased from a program executed by a server. In addition, the prediction of the heat generation amount of the electronic component 30 may be performed through analysis of a flow field and a temperature field using computational fluid dynamics (CFD).

The actions and effects of the present embodiment described above are as follows.

Since the plurality of nozzles 32 are provided to be parallel in the width direction (x direction) of the substrate, a plurality of flows of the cooling liquid Lq flowing from the lower end toward the upper side of the substrate 11 are formed to be parallel. Accordingly, by appropriately setting a flow rate distribution of the cooling liquid Lq in the width direction, the electronic component 30 that requires cooling can be selectively cooled.

By controlling the flow rate regulating unit 34 provided in each nozzle 32, a cooling amount in the width direction (x direction) can be appropriately changed. As a result, cooling according to the load of the electronic component 30 can be performed.

By increasing an ejecting flow rate of the nozzle 32 corresponding to the electronic component 30*a* (refer to FIG. 4) predicted to have a relatively high temperature, the electronic component 30*a* having a relatively high temperature can be selectively cooled.

In addition, instead of or in addition to the above-described prediction of the heat generation amount of the electronic component 30, the temperature of each electronic component 30 may be measured by a temperature sensor, and the flow rate regulating unit 34 may be controlled based on the measurement result.

Second Embodiment

Next, a second embodiment of the present disclosure will be described. The present embodiment is different from the first embodiment in that a turbulence promoting member for promoting cooling of the electronic component 30 is provided. Therefore, in the following description, only a configuration different from the configuration of the first embodiment will be described, and common components will be designated by the same reference numerals, and the description thereof will be omitted.

Figure 5:
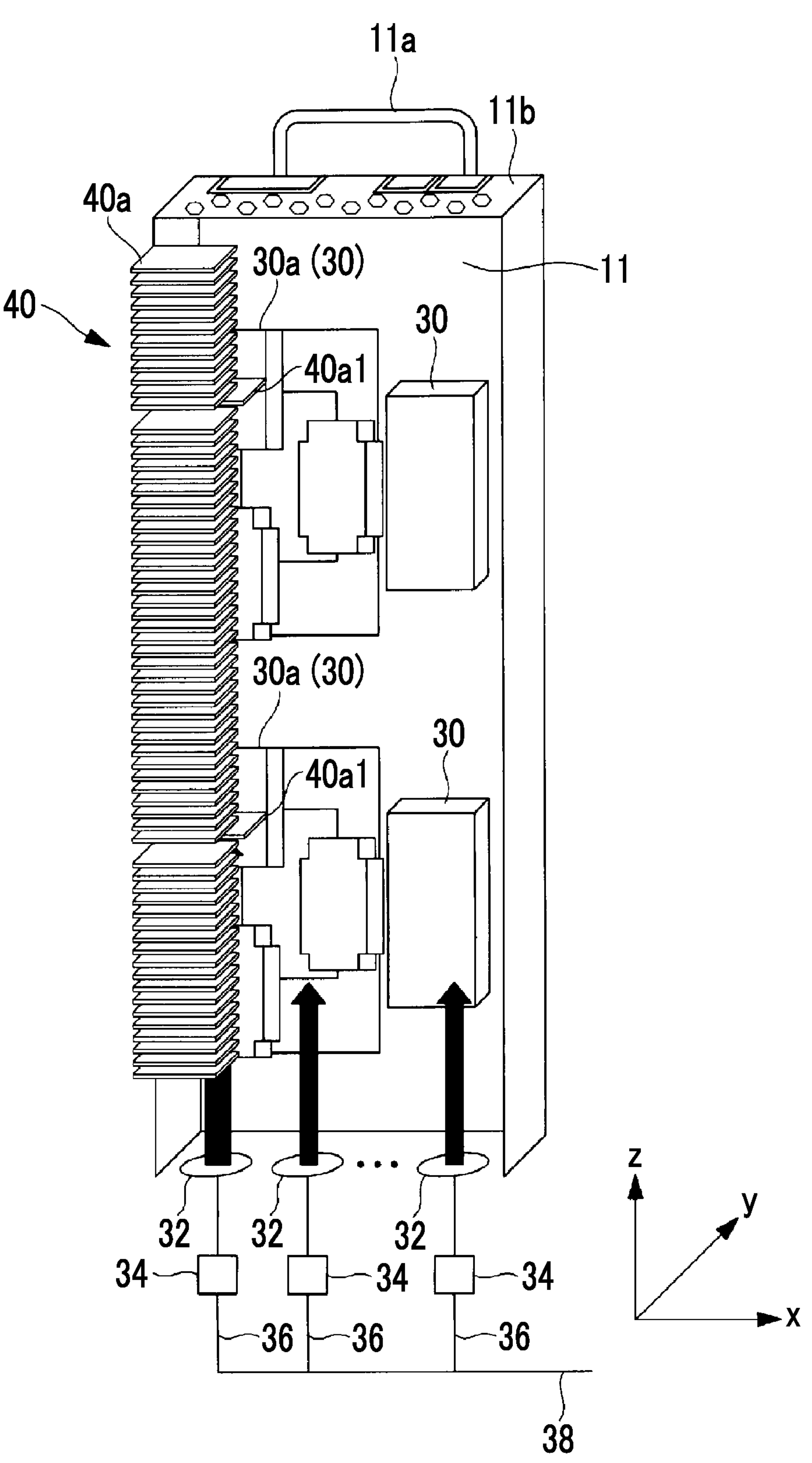
FIG. 5 is a perspective view illustrating a second embodiment of the present disclosure.

As illustrated in FIG. 5, a turbulence promoting member 40 is provided so as to face the electronic component 30. A predetermined interval is provided between the turbulence promoting member 40 and the electronic component 30.

The turbulence promoting member 40 includes a plurality of plate-shaped bodies (advancing and retreating members) 40*a* having a flat plate shape. Each plate-shaped body 40*a* is laminated at a predetermined interval in the vertical direction (z direction). Each plate-shaped body 40*a* is disposed in a direction in which plane portions of each plate-shaped body 40*a* are orthogonal to the flow of the cooling liquid Lq ejected from the nozzle 32.

Each plate-shaped body 40*a* is held by a holding portion (not illustrated) and advances and retreats via an actuator (not illustrated) so as to be able to approach or move away from the electronic component 30. The advance and retreat of each plate-shaped body 40*a* is controlled by the control unit.

Each plate-shaped body 40*a* is set to a position such that the position is separated from each electronic component 30 in a case where the load of each electronic component 30 is in the presumed normal state.

Figure 6:
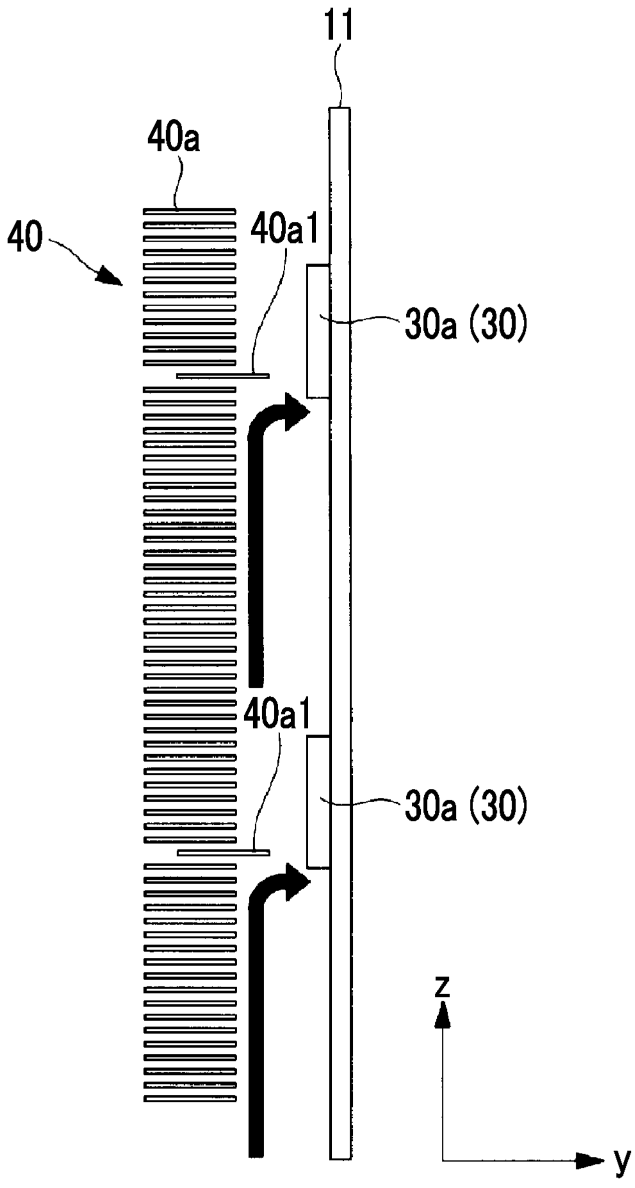
FIG. 6 is a side view of FIG. 5.

In a case where it is predicted that the load of the specific electronic component 30*a* is larger than the load in the normal state and that the heat generation amount is larger than the normal heat generation amount, or in a case where the heat generation amount is measured to be large by the temperature sensor, a plate-shaped body 40*a*1 at a position facing the electronic component 30 having a large heat generation amount is protruded so as to approach the electronic component 30. As a result, a flow path area of the cooling liquid Lq flowing on the electronic component 30*a* is narrowed. Then, as indicated by an arrow in FIG. 6, the flow of the cooling liquid Lq ejected from the nozzle 32 is disrupted, the heat transfer performance of the electronic component 30*a* having a large heat generation amount is improved, so that cooling is promoted.

The turbulence promoting member 40 does not need to be provided so as to correspond to the entire surface of the substrate 11, and may be provided only to a region corresponding to the electronic component 30 (for example, CPU) where a large amount of heat is expected to be generated.

The immersion cooling device and the control method therefor described in each of above-described embodiments are understood as follows, for example.

According to one aspect of the present disclosure, there is provided an immersion cooling device (1) including a container (3) in which a cooling liquid is stored, a substrate (11)

that is disposed to be immersed in the cooling liquid in the container and to which a plurality of electronic components (30) are mounted, and a nozzle (32) that ejects the cooling liquid such that the cooling liquid flows from one end toward the other end of the substrate, over a surface on which the electronic components are provided, in which a plurality of the nozzles are provided such that a plurality of cooling liquid flows flowing from the one end toward the other end of the substrate are formed to be parallel.

By ejecting the cooling liquid from the nozzle, the cooling liquid flows over the surface of the substrate immersed in the cooling liquid. As a result, the electronic component mounted on the substrate is cooled.

The plurality of nozzles are provided such that the plurality of cooling liquid flows flowing from one end toward the other end of the substrate are formed to be parallel. Accordingly, by appropriately setting the flow rate distribution of the cooling liquid in the width direction, the electronic component that requires cooling can be selectively cooled.

According to one aspect of the present disclosure, there is provided the immersion cooling device including a flow rate regulating unit (34) that is provided on each nozzle and that regulates a flow rate of the ejected cooling liquid, and a control unit that controls each flow rate regulating unit.

By controlling the flow rate regulating unit provided in each nozzle, a cooling amount in the width direction can be appropriately changed.

According to one aspect of the present disclosure, there is provided the immersion cooling device in which the control unit controls the flow rate regulating unit such that a flow rate of the nozzles corresponding to the electronic component predicted to have a relatively high temperature among the plurality of electronic components is larger than a flow rate of the other nozzles.

By increasing a flow rate of the nozzle corresponding to the electronic component predicted to have a relatively high temperature, the electronic component having a relatively high temperature can be selectively cooled.

The temperature prediction of electronic component can be performed, for example, based on the analysis of the flow field and the temperature field by computational fluid d dynamics (CFD) or the predicted calculation load.

According to one aspect of the present disclosure, there is provided the immersion cooling device including a temperature sensor that measures a temperature of each electronic component described above, in which the control unit controls the flow rate regulating unit based on a measured value of the temperature sensor.

The temperature of each electronic component is measured by a temperature sensor, and the flow rate regulating unit is controlled based on the measurement result. As a result, it is possible to realize a flow rate distribution according to the heat generation amount of each electronic component.

According to one aspect of the present disclosure, there is provided the immersion cooling device including a turbulence promoting member (40) that operates to disrupt the cooling liquid flow flowing on the electronic components, in which the control unit operates the turbulence promoting member corresponding to the electronic component predicted to have a relatively high temperature or the electronic component measured to have a relatively high temperature.

The turbulence promoting member corresponding to the electronic component that is predicted to or measured to have a high temperature is operated. As a result, the cooling liquid flow flowing on the electronic component is disrupted by the turbulence promoting member, so that the heat transfer performance is improved and cooling can be promoted.

According to one aspect of the present disclosure, there is provided the immersion cooling device, in which the turbulence promoting member includes an advancing and retreating member (40*a*) that advances and retreats with respect to the electronic component.

By advancing the advancing and retreating member with respect to the electronic component, the flow path area of the cooling liquid flowing on the electronic component is narrowed, so that the flow is disrupted. As a result, the cooling of the electronic component can be promoted.

On the other hand, by retracting the advancing and retreating member with respect to the electronic component, the flow path of the cooling liquid flowing on the electronic component is returned to the normal flow path area. As a result, the cooling amount can be the same as cooling amounts of the other electronic components.

According to one aspect of the present disclosure, there is provided a control method for an immersion cooling device including a container in which a cooling liquid is stored, a substrate that is disposed to be immersed in the cooling liquid in the container and to which a plurality of electronic components are mounted, and a nozzle that ejects the cooling liquid such that the cooling liquid flows from one end toward the other end of the substrate, over a surface on which the electronic components are provided, in which a plurality of the nozzles are provided such that a plurality of cooling liquid flows flowing from the one end toward the other end of the substrate are formed to be parallel, the control method including: regulating a flow rate of the cooling liquid ejected from each nozzle.

REFERENCE SIGNS LIST

1: immersion cooling device
3: liquid tank rack (container)
3*a*: main body
3*b*: side wall portion
3*c*: opening-closing lid
5: pump unit
7: cooling device
11: substrate
11*a*: grip portion
11*b*: perforated wall
11*c*: side plate
13: liquid feed pipe
13*a*: downstream end
13*b*: upstream end
15: liquid return pipe
17: heat exchanger
19: liquid pump
21: cooling liquid ejecting pipe
23: fan
25: cooling water supply pipe
26: cooling water return pipe
30: electronic component
32: nozzle
34: flow rate regulating unit
36: branch pipe
38: main supply pipe
40: turbulence promoting member
40*a*: plate-shaped body (advancing and retreating member)
Lq: cooling liquid

The invention claimed is:

1. An immersion cooling device comprising:

a container in which a cooling liquid is stored;

a substrate that is disposed to be immersed in the cooling liquid in the container and to which a plurality of electronic components are mounted;

a plurality of nozzles that are configured to eject the cooling liquid such that the cooling liquid flows from one end of the substrate toward the other end of the substrate over a surface of the substrate on which the plurality of electronic components are mounted;

a plurality of flow rate regulating valves each of which is connected to a corresponding one of the plurality of nozzles via a pipe and configured to regulate a flow rate of the cooling liquid ejected from the corresponding one of the plurality of nozzles; and a control unit that is configured to control each of the plurality of flow rate regulating valves, wherein the plurality of nozzles are disposed such that a plurality of cooling liquid flows flowing from the one end toward the other end of the substrate are formed to be parallel.

2. The immersion cooling device according to claim 1, further comprising:

a temperature sensor that is configured to measure a temperature of each of the plurality of electronic components, wherein the control unit is configured to control the plurality of flow rate regulating valves based on a measured value of the temperature sensor.

3. The immersion cooling device according to claim 1, wherein the control unit controls the plurality of flow rate regulating valves such that a flow rate of two or more of the plurality of nozzles corresponding to one of the plurality of electronic components that is predicted to have a high temperature is larger than a flow rate of the other of the plurality of nozzles.

4. The immersion cooling device according to claim 3, further comprising:

a plurality of turbulence promoting members that are configured to disrupt the cooling liquid flows flowing on the plurality of electronic components, wherein the control unit is configured to operate one of the plurality of turbulence promoting members corresponding to one of the plurality of electronic components that is predicted or measured to have a high temperature.

5. The immersion cooling device according to claim 4, wherein the plurality of turbulence promoting members include an advancing and retreating member that is configured to advance and retreat with respect to the plurality of electronic components.

6. A control method for an immersion cooling device including a container in which a cooling liquid is stored, a substrate that is disposed to be immersed in the cooling liquid in the container and to which a plurality of electronic components are mounted, a plurality of nozzles that eject the cooling liquid such that the cooling liquid flows from one end of the substrate toward the other end of the substrate over a surface of the substrate on which the electronic components are mounted, and a plurality of flow rate regulating valves each of which is connected to a corresponding one of the plurality of nozzles via a pipe and regulates a flow rate of the cooling liquid ejected from the corresponding one of the plurality of nozzles, wherein the plurality of nozzles are disposed such that a plurality of cooling liquid flows flowing from the one end toward the other end of the substrate are formed to be parallel, the control method comprising:

regulating the flow rate of the cooling liquid ejected from each of the plurality of nozzles by controlling each of the plurality of flow rate regulating valves.

* * * * *